(12) United States Patent
Wang

(10) Patent No.: US 11,374,085 B2
(45) Date of Patent: Jun. 28, 2022

(54) ORGANIC LIGHT-EMITTING DIODE DISPLAY PANEL, METHOD OF MANUFACTURING SAME, AND DISPLAY DEVICE

(71) Applicant: Wuhan China Star Optoelectronics Semiconductor Display Technology Co., Ltd., Wuhan (CN)

(72) Inventor: Chaohuan Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 201 days.

(21) Appl. No.: 16/772,815

(22) PCT Filed: Mar. 31, 2020

(86) PCT No.: PCT/CN2020/082585
§ 371 (c)(1),
(2) Date: Jun. 15, 2020

(87) PCT Pub. No.: WO2021/179365
PCT Pub. Date: Sep. 16, 2021

(65) Prior Publication Data
US 2022/0130936 A1    Apr. 28, 2022

(30) Foreign Application Priority Data

Mar. 12, 2020  (CN) .......................... 202010171005.6

(51) Int. Cl.
*H01L 27/32*    (2006.01)
*H01L 51/00*    (2006.01)
(Continued)

(52) U.S. Cl.
CPC ......... *H01L 27/3276* (2013.01); *G09G 3/006* (2013.01); *H01L 51/0097* (2013.01);
(Continued)

(58) Field of Classification Search
None
See application file for complete search history.

(56) References Cited

U.S. PATENT DOCUMENTS

2007/0194348 A1    8/2007  Yang et al.
2018/0083194 A1    3/2018  Lee et al.
(Continued)

FOREIGN PATENT DOCUMENTS

CN    106782255    5/2017
CN    106952933    7/2017
(Continued)

OTHER PUBLICATIONS

Machine translation of CN-108565278 (Year: 2018).*

*Primary Examiner* — J. E. Schoenholtz

(57) ABSTRACT

An organic light-emitting diode display panel, a method of manufacturing the same, and a display device are provided. The organic light-emitting diode display panel includes a flexible substrate defined with a test circuit region thereon. The test circuit region is provided with a test circuit and defined with a circuit trace region. The circuit trace region includes a plurality of traces, a plurality of transistors, a control line, and at least one pin. Each one of the traces is connected to one of the transistors. The control line is electrically connected to a control end of each of the transistors to turn on or turn off the transistors to avoid the circuit from short-circuiting.

17 Claims, 2 Drawing Sheets

(51) Int. Cl.
*G09G 3/00* (2006.01)
*H01L 51/56* (2006.01)
*H01L 51/52* (2006.01)

(52) U.S. Cl.
CPC .............. *H01L 51/52* (2013.01); *H01L 51/56* (2013.01); *H01L 2227/323* (2013.01)

(56) References Cited

U.S. PATENT DOCUMENTS

2020/0234619 A1    7/2020  Dai
2021/0020085 A1*  1/2021  Lin ........................ G09G 3/006

FOREIGN PATENT DOCUMENTS

| CN | 108565278 | | 9/2018 |
| CN | 108565278 A | * | 9/2018 |
| CN | 109461396 | | 3/2019 |
| CN | 109659277 | | 4/2019 |

\* cited by examiner

ORGANIC LIGHT-EMITTING DIODE DISPLAY PANEL, METHOD OF MANUFACTURING SAME, AND DISPLAY DEVICE

RELATED APPLICATIONS

This application is a National Phase of PCT Patent Application No. PCT/CN2020/082585 having International filing date of Mar. 31, 2020, which claims the benefit of priority of Chinese Patent Application No. 202010171005.6 filed on Mar. 12, 2020. The contents of the above applications are all incorporated by reference as if fully set forth herein in their entirety.

FIELD AND BACKGROUND OF THE INVENTION

The present disclosure relates to display technologies, and more particularly, to an organic light-emitting diode display panel, a method of manufacturing the same, and a display device.

Generally, an organic light-emitting diode display panel uses a substrate larger than a display area, and a test circuit is fabricated on the substrate to simplify the process steps. After the test is completed, part of the test circuit is removed. During removal, the test circuit and the substrate are cut off by laser cutting or the like.

However, high temperature generated during the laser cutting process may cause a conductor material of an original trace to melt, splash or remain, resulting in a short circuit between adjacent trace. Organic molecules on the substrate may also be cracked into small molecules with conductivity under the high temperature of the laser, resulting in short circuit of the traces.

Therefore, there is an urgent need for a multiplexing circuit to solve the above problems.

The high temperature generated during the laser cutting process of the existing organic light-emitting diode display panel may cause the conductor material of the original trace to melt, splash or remain, resulting in short circuit between the adjacent trace. The organic molecules on the substrate may also be cracked into small molecules with conductivity under the high temperature of the laser, resulting in short circuit of the traces.

SUMMARY OF THE INVENTION

In view of the above, the present disclosure provides an organic light-emitting diode display panel, a method of manufacturing the same, and a display device to provide transistors to isolate ends of traces to avoid the ends of the traces from issues of short circuit between traces after laser cutting.

In order to achieve above-mentioned object of the present disclosure, one embodiment of the disclosure provides an organic light-emitting diode display panel including a flexible substrate. The flexible substrate is defined with a display region and a test circuit region thereon. The test circuit region is provided with a test circuit and defined with a circuit trace region. The circuit trace region includes a plurality of traces, a plurality of transistors, a control line, and at least one pin. Each one of the traces is connected to one of the transistors. The control line is electrically connected to a control end of each of the transistors to turn on or turn off the transistors. The at least one pin is electrically connected to an end of the control line.

In one embodiment of the organic light-emitting diode display panel, the transistors are disposed at ends of the traces.

In one embodiment of the organic light-emitting diode display panel, the test circuit includes a cell test circuit. A bonding region is defined between the cell test circuit and the plurality of transistors. The pin is disposed in the bonding region.

In one embodiment of the organic light-emitting diode display panel, the test circuit includes a cell test circuit. Pad regions of the cell test circuit are provided at two opposite sides of the cell test circuit. The pin is disposed in the pad regions of the cell test circuit.

In one embodiment of the organic light-emitting diode display panel, the test circuit further includes an array test circuit disposed at ends of the plurality of traces.

In one embodiment of the organic light-emitting diode display panel, a gate driving circuits are provided at both sides of the display region. Control traces of the gate driving circuits are extended to the pad regions of the cell test circuit.

In one embodiment of the organic light-emitting diode display panel, a bonding region is provided between the cell test circuit and the plurality of transistors. A plurality of the pins are provided. At least one of the plurality of pins is disposed in the bonding region.

In one embodiment of the organic light-emitting diode display panel, the test circuit includes a cell test circuit. Pad regions of the cell test circuit are provided at two opposite sides of the cell test circuit. A bonding region is provided between the cell test circuit and the plurality of transistors. A plurality of the pins are provided. At least one of the plurality of pins is disposed in the bonding region. Another one of the pins is disposed in the pad regions of the cell test circuit.

Another embodiment of the disclosure provides a display device including an organic light-emitting diode display panel and a control circuit. The organic light-emitting diode display panel includes a flexible substrate. The flexible substrate is defined with a display region and a test circuit region thereon. The test circuit region is provided with a test circuit and defined with a circuit trace region. The circuit trace region includes a plurality of traces, a plurality of transistors, a control line, and at least one pin. Each one of the traces is connected to one of the transistors. The control line is electrically connected to a control end of each of the transistors to turn on or turn off the transistors. The at least one pin is electrically connected to an end of the control line. The control circuit control a display of the display region through the circuit trace region.

In one embodiment of the display device, the transistors are disposed at ends of the traces.

In one embodiment of the display device, the test circuit includes a cell test circuit, and a bonding region is defined between the cell test circuit and the plurality of transistors, wherein the pin is disposed in the bonding region.

In one embodiment of the display device, the test circuit includes a cell test circuit, and pad regions of the cell test circuit are provided at two opposite sides of the cell test circuit, wherein the pin is disposed in the pad regions of the cell test circuit.

In one embodiment of the display device, the test circuit includes a cell test circuit. Pad regions of the cell test circuit are provided at two opposite sides of the cell test circuit. A bonding region is provided between the cell test circuit and the plurality of transistors. A plurality of the pins are provided. At least one of the pins is disposed in the bonding region, and another one of the pins is disposed in the pad regions of the cell test circuit.

Another embodiment of the disclosure provides a method of manufacturing an organic light-emitting diode display panel. The organic light-emitting diode display panel includes a flexible substrate. The flexible substrate is defined with a display region and a test circuit region thereon. The test circuit region is provided with a test circuit and defined with a circuit trace region. The circuit trace region includes a plurality of traces, a plurality of transistors, a control line, and at least one pin. Each one of the traces is connected to one of the transistors. The control line is electrically connected to a control end of each of the transistors to turn on or turn off the transistors. The at least one pin is electrically connected to an end of the control line. The test circuit further includes an array test circuit disposed at ends of the plurality of traces. The manufacturing method includes steps of: performing an array test to a pixel array in the display region by sending a test signal thereto through the array test circuit; and performing a laser cutting to cutoff the array test circuit along a cutting line after the array test.

In one embodiment of the disclosure, the method of manufacturing the organic light-emitting diode display panel further includes a step of: turning off one or several of the plurality of transistors to isolating a shorting trace from other regions of the traces.

In one embodiment of the method of manufacturing the organic light-emitting diode display panel, the test circuit includes a cell test circuit, and pad regions of the cell test circuit are provided at two opposite sides of the cell test circuit, wherein the pin is disposed in the pad regions of the cell test circuit.

In one embodiment of the method of manufacturing the organic light-emitting diode display panel, a gate driving circuits are provided at both sides of the display region, and control traces of the gate driving circuits are extended to the pad regions of the cell test circuit.

In one embodiment of the method of manufacturing the organic light-emitting diode display panel, a cell test signal is transmitted to the cell test circuit through the pad region of the cell test circuit when the organic light-emitting diode display panel is undergone a cell test. The plurality of transistors are turned off through the pin in the pad region of the cell test circuit to avoid the cell test from interference.

In one embodiment of the method of manufacturing the organic light-emitting diode display panel, the cutting line is defined between the array test circuit and the transistors. The array test circuit is cut off by the laser along the cutting line after the array test is finished. The transistors are located at ends of the traces after the array test circuit is cut off.

In comparison with prior art, the organic light-emitting diode display panel, the method of manufacturing the same, and the display device provides the control line electrically connected to the control end of each of the transistors to turn on or turn off the transistors. It can control the traces to be electrical conduct before laser cutting to undergo a test and control the ends of the traces to be open circuit after laser cutting to avoid yield of the organic light-emitting diode display panel from affected by short-circuiting of the ends of the traces.

DESCRIPTION OF SPECIFIC EMBODIMENTS OF THE INVENTION

Figure 1:
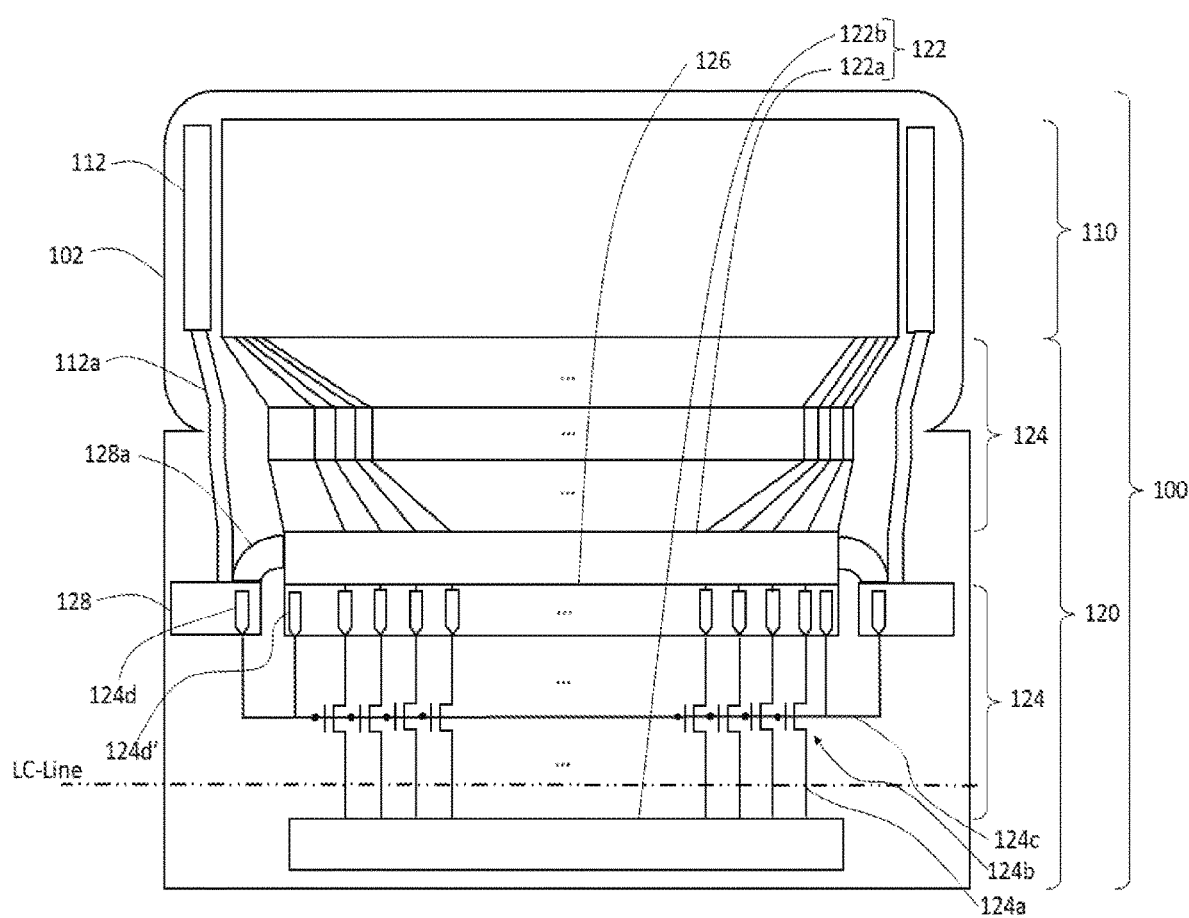
FIG. 1 is a schematic view of a structure of an organic light-emitting diode display panel according to an embodiment of the present disclosure.

The descriptions of the following embodiments refer to the attached drawings to illustrate specific embodiments that can be implemented in the present disclosure.

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

In the figure, units with similar structures are indicated by the same reference numerals.

Referring to FIG. 1, one embodiment of the disclosure provides an organic light-emitting diode display panel 100 including a flexible substrate 102. The flexible substrate 102 is defined with a display region 110 and a test circuit region 120 thereon. The test circuit region 120 is provided with a test circuit 122 and defined with a circuit trace region 124. The circuit trace region 124 includes a plurality of traces 124a, a plurality of transistors 124b, a control line 124c, and at least one pin 124d. Each one of the traces 124a is connected to one of the transistors 124b. The control line 124c is electrically connected to a control end of each of the transistors 124b to turn on or turn off the transistors 124b. The at least one pin 124d is electrically connected to an end of the control line 124c.

Referring to FIG. 1, in one embodiment of the organic light-emitting diode display panel 100, the test circuit 122 includes a cell test circuit 122a. A bonding region 126 is defined between the cell test circuit 122a and the plurality of transistors 124b. The pin 124d' is disposed in the bonding region 126.

In detail, a corresponding test circuit electrically connects with the plurality of traces 124a through the bonding region 126 when the organic light-emitting diode display panel 100 is undergone a module test. The pin 124d' is disposed in the bonding region 126 to connected to a corresponding signal in the module test to turn off the plurality of transistors 124b to avoid the module test from interference.

Referring to FIG. 1, in one embodiment of the organic light-emitting diode display panel 100, the test circuit 122 includes a cell test circuit 122a. Pad regions 128 of the cell test circuit are provided at two opposite sides of the cell test circuit 122a. The pin 124d is disposed in the pad regions 128 of the cell test circuit.

In detail, a corresponding test circuit electrically connects with the cell test circuit 122a through the pad region 128 of the cell test circuit when the organic light-emitting diode display panel 100 is undergone a cell test. The pin 124d is disposed in the pad region 128 of the cell test circuit to connected to a corresponding signal in the cell test to turn off the plurality of transistors 124b to avoid the cell test from interference.

Referring to FIG. 1, in one embodiment of the organic light-emitting diode display panel 100, the test circuit 122 further includes an array test circuit 122b disposed at ends of the plurality of traces 124a.

In detail, the array test circuit 122b electrically connects with a pixel array (not shown) in the display region 110 through the traces 124a when the organic light-emitting diode display panel 100 is undergone an array test. The pin 124d or 124d' controls the plurality of transistors 124b to turn on to make the traces 124a conductive to pass a test signal into the pixel array in the display region 110.

In detail, a laser cutting can be performed to cutoff the array test circuit 122b along a cutting line LC-Line after the array test.

Referring to FIG. 1, in one embodiment of the organic light-emitting diode display panel 100, a gate driving circuits 112 are provided at both sides of the display region 110. Control traces 112a of the gate driving circuits 112 are extended to the pad regions 128 of the cell test circuit.

In detail, the gate driving circuits 112 and the control traces 112a at both sides of the display region 100 have symmetric components about the display region 100, so the FIG. 1 only shows one of the components at one of the sides.

Referring to FIG. 1, in one embodiment of the organic light-emitting diode display panel 100, a bonding region 126 is provided between the cell test circuit 122a and the plurality of transistors 124b. A plurality of the pins 124d, 124d' are provided. At least one of the plurality of pins 124d' is disposed in the bonding region 126.

In detail, a number of pins can be adjusted according to actual needs, and the present disclosure is not limited.

Figure 2:
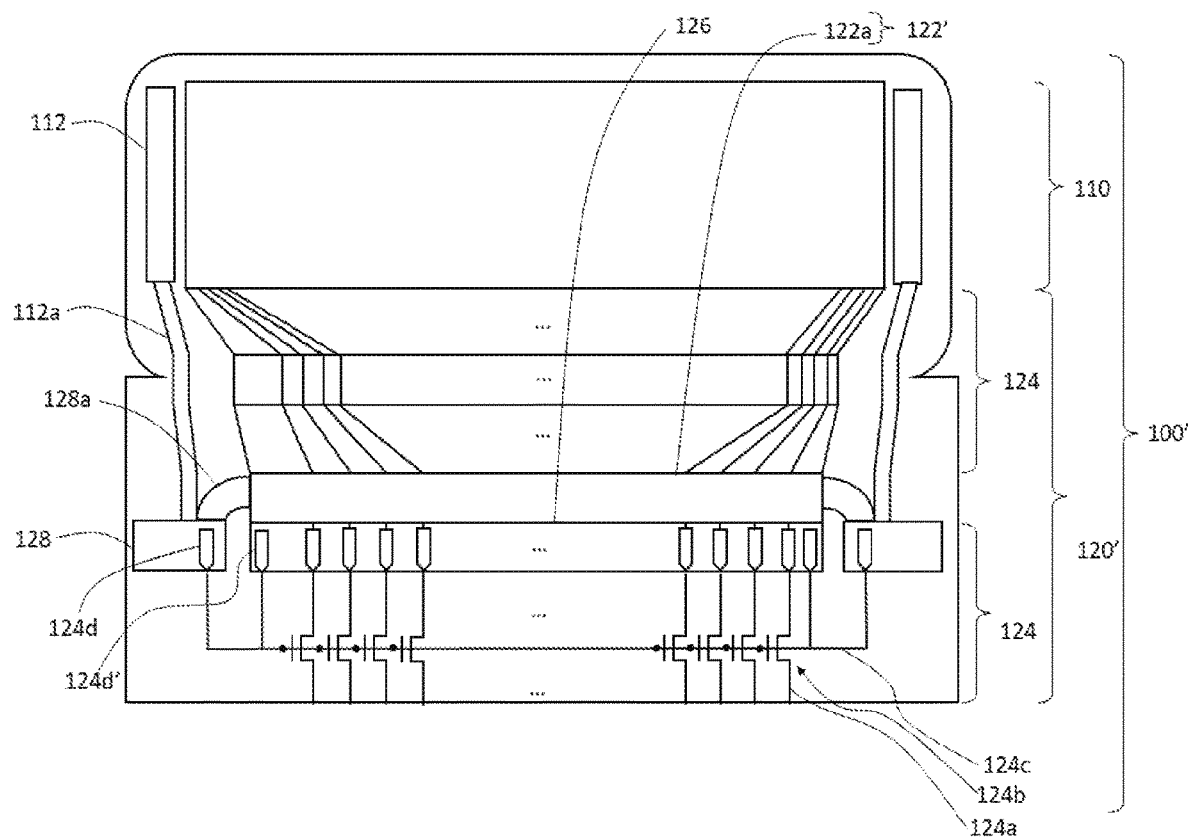
FIG. 2 is a schematic view of a structure of an organic light-emitting diode display panel according to another embodiment of the present disclosure.

Referring to FIG. 2, in one embodiment of the organic light-emitting diode display panel 100', the transistors 124b are disposed at ends of the traces 124a.

In detail, a laser cutting can be performed to cutoff the array test circuit 122b along a cutting line LC-Line in FIG. 1 after the array test. Then, the transistors 124b are disposed at ends of the traces 124a as shown in FIG. 2. If high temperature generated during the laser cutting process on a cutting region cause a conductor material of an original trace to melt, splash or remain, resulting in a short circuit between adjacent trace, turning off one or several of the plurality of transistors can isolate a shorting region from other regions of the traces to avoid a following test and yield of products from affected.

Referring to FIG. 2, in one embodiment of the organic light-emitting diode display panel 100', the test circuit 122' includes a cell test circuit 122a. Pad regions 128 of the cell test circuit are provided at two opposite sides of the cell test circuit 122a. A bonding region 126 is provided between the cell test circuit 122a and the plurality of transistors 124b. A plurality of the pins 124d, 124d' are provided. At least one of the plurality of pins 124d' is disposed in the bonding region 126. Another one of the pins 124d is disposed in the pad regions 128 of the cell test circuit.

In detail, a description of the pin 124d, 124d' please refer the abovementioned paragraph, the disclosure will not repeat here.

Figure 3:
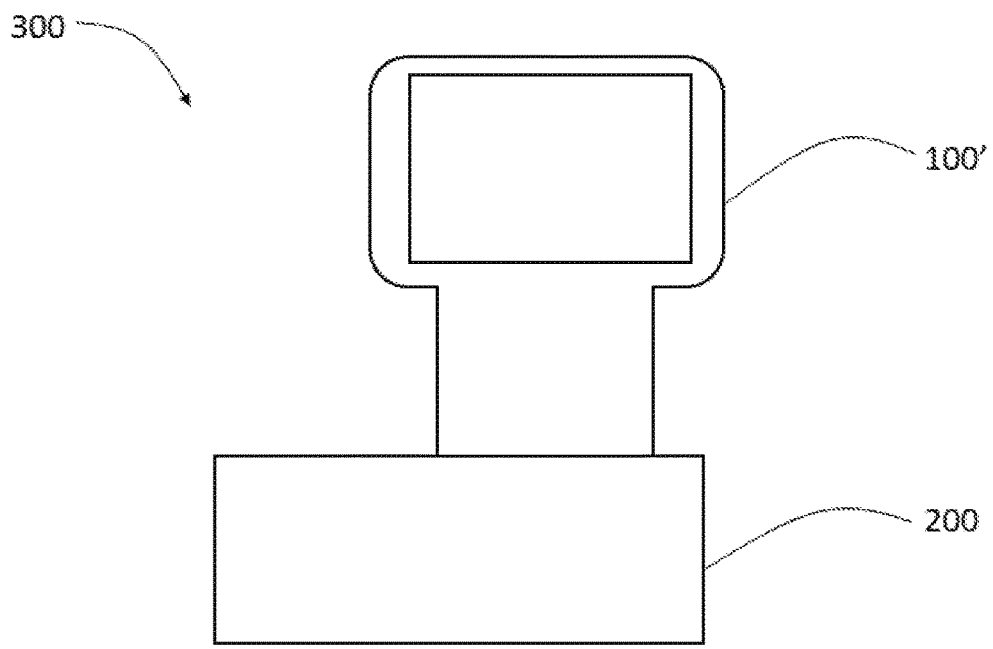
FIG. 3 is a schematic view of a structure of display device according to an embodiment of the present disclosure.

Referring to FIG. 3, another embodiment of the disclosure provides a display device 300 including an organic light-emitting diode display panel 100' as shown in FIG. 2 and a control circuit 200. The control circuit 200 control a display of the display region through the circuit trace region.

In detail, means of electrical connect between the organic light-emitting diode display panel 100' and the control circuit 200 can be welding or socketing, the disclosure is not limit.

In comparison with prior art, the organic light-emitting diode display panel, the method of manufacturing the same, and the display device provides the control line electrically connected to the control end of each of the transistors to turn on or turn off the transistors. It can control the traces to be electrical conduct before laser cutting to undergo a test and control the ends of the traces to be open circuit after laser cutting to avoid yield of the organic light-emitting diode display panel from affected by short-circuiting of the ends of the traces.

Although the present disclosure has been shown and described with respect to one or more embodiments, those skilled in the art will obtain equivalent variations and modifications based on reading and understanding of this specification and the drawings. This disclosure includes all such modifications and variations, and is limited only by the scope of the appended claims. With particular reference to the various functions performed by the above-mentioned components, the terminology used to describe such components is intended to correspond to any component (unless otherwise indicated) that performs the specified function of the component (eg, it is functionally equivalent) Even if it is structurally different from the disclosed structure that performs the functions in the exemplary embodiment of the present specification shown herein. Furthermore, although specific features of this specification have been disclosed with respect to only one of several embodiments, such features may be combined with one or more other embodiments as may be desirable and advantageous for a given or specific application. Moreover, to the extent that the terms "including", "having", "containing" or variations thereof are used in specific embodiments or claims, such terms are intended to be included in a manner similar to the term "comprising".

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An organic light-emitting diode display panel, comprising:
a flexible substrate, wherein the flexible substrate is defined with a display region and a test circuit region thereon, the test circuit region is provided with a test circuit and defined with a circuit trace region, the circuit trace region comprises a plurality of traces, a plurality of transistors, a control line, and one or more pins, each one of the traces is connected to one of the transistors, the control line is electrically connected to a control end of each of the transistors to turn on or turn off the transistors, at least one pin is electrically connected to an end of the control line, the test circuit comprises a cell test circuit, a bonding region is defined between the cell test circuit and the plurality of transistors, and the at least one pin is disposed in the bonding region.

2. The organic light-emitting diode display panel according to claim 1, wherein the transistors are disposed at ends of the traces.

3. The organic light-emitting diode display panel according to claim 1, wherein the test circuit further comprises an array test circuit disposed at ends of the plurality of traces.

4. The organic light-emitting diode display panel according to claim 1, wherein pad regions of the cell test circuit are provided at two opposite sides of the cell test circuit, and wherein another one of the pins is disposed in the pad regions of the cell test circuit.

5. The organic light-emitting diode display panel according to claim 4, wherein the test circuit further comprises an array test circuit disposed at ends of the plurality of traces.

6. The organic light-emitting diode display panel according to claim 5, wherein a gate driving circuits are provided at both sides of the display region, and control traces of the gate driving circuits are extended to the pad regions of the cell test circuit.

7. The organic light-emitting diode display panel according to claim 2, wherein pad regions of the cell test circuit are provided at two opposite sides of the cell test circuit, and another one of the pins is disposed in the pad regions of the cell test circuit.

8. A display device, comprising an organic light-emitting diode display panel, and a control circuit, wherein the organic light-emitting diode display panel comprises:
a flexible substrate, wherein the flexible substrate is defined with a display region and a test circuit region thereon, the test circuit region is provided with a test circuit and defined with a circuit trace region, the circuit trace region comprises a plurality of traces, a plurality of transistors, a control line, and one or more pins, each one of the traces is connected to one of the transistors, the control line is electrically connected to a control end of each of the transistors to turn on or turn off the transistors, at least one pin is electrically connected to an end of the control line, the control circuit controls a display of the display region through the circuit trace region, the test circuit comprises a cell test circuit, a bonding region is defined between the cell test circuit and the plurality of transistors, and the at least one pin is disposed in the bonding region.

9. The display device according to claim 8, wherein the transistors are disposed at ends of the traces.

10. The display device according to claim 8, wherein pad regions of the cell test circuit are provided at two opposite sides of the cell test circuit, and wherein another one of the pins is disposed in the pad regions of the cell test circuit.

11. The display device according to claim 9, wherein pad regions of the cell test circuit are provided at two opposite sides of the cell test circuit, and wherein another one of the pins is disposed in the pad regions of the cell test circuit.

12. A method of manufacturing an organic light-emitting diode display panel, wherein the organic light-emitting diode display panel, comprises a flexible substrate, wherein the flexible substrate is defined with a display region and a test circuit region thereon, the test circuit region is provided with a test circuit and defined with a circuit trace region, the circuit trace region comprises a plurality of traces, a plurality of transistors, a control line, and at least one pin, each one of the traces is connected to one of the transistors, the control line is electrically connected to a control end of each of the transistors to turn on or turn off the transistors, and the at least one pin is electrically connected to an end of the control line, wherein the test circuit further comprises an array test circuit disposed at ends of the plurality of traces, and the manufacturing method comprises steps of:
performing an array test to a pixel array in the display region by sending a test signal thereto through the array test circuit; and
performing a laser cutting to cutoff the array test circuit along a cutting line after the array test.

13. The method of manufacturing the organic light-emitting diode display panel according to claim 12, further comprising a step of: turning off one or several of the plurality of transistors to isolating a shorting trace from other regions of the traces.

14. The method of manufacturing the organic light-emitting diode display panel according to claim 12, wherein the test circuit comprises a cell test circuit, and pad regions of the cell test circuit are provided at two opposite sides of the cell test circuit, wherein the pin is disposed in the pad regions of the cell test circuit.

15. The method of manufacturing the organic light-emitting diode display panel according to claim 14, wherein a gate driving circuits are provided at both sides of the display region, and control traces of the gate driving circuits are extended to the pad regions of the cell test circuit.

16. The method of manufacturing the organic light-emitting diode display panel according to claim 14,
wherein a cell test signal is transmitted to the cell test circuit through the pad region of the cell test circuit when the organic light-emitting diode display panel is undergone a cell test; and
wherein the plurality of transistors are turned off through the pin in the pad region of the cell test circuit to avoid the cell test from interference.

17. The method of manufacturing the organic light-emitting diode display panel according to claim 12, wherein the cutting line is defined between the array test circuit and the transistors, the array test circuit is cut off by the laser along the cutting line after the array test is finished, and the transistors are located at ends of the traces after the array test circuit is cut off.

* * * * *